(12) United States Patent
Koyama et al.

(10) Patent No.: US 6,765,510 B2
(45) Date of Patent: Jul. 20, 2004

(54) ENTROPY ENCODER/DECODER (75) Inventors: Akihisa Koyama, Kanagawa (JP); Yasushi Nishi, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 10/371,630

(22) Filed: Feb. 20, 2003

(65) Prior Publication Data

US 2003/0156050 A1 Aug. 21, 2003

(30) Foreign Application Priority Data

Feb. 21, 2002 (JP) .................................. P2002-045250

(51) Int. Cl.[7] .............................................. H03M 7/34
(52) U.S. Cl. ........................................ 341/51; 341/50
(58) Field of Search ............................... 341/51, 50, 67

(56) References Cited

U.S. PATENT DOCUMENTS 5,654,702 A * 8/1997 Ran ........................... 341/51

2003/0169190 A1 * 9/2003 Spasojevic ................... 341/50

* cited by examiner

Primary Examiner—Brian Young
Assistant Examiner—Joseph Lauture
(74) Attorney, Agent, or Firm—Frommer Lawrence & Haug LLP; William S. Frommer; Darren A. Simon (57) ABSTRACT

An EBCOT codec (1) is provided which includes a bit modeling unit (11), arithmetic codec (12), input FIFO memory (13), output FIFO memory (14) and a controller (16). The input and output FIFO memories (13) and (14) have a function to control the bit length of to-be-stored data correspondingly to that of supplied data. For the coding, the input FIFO memory (13) is supplied with a wavelet transform coefficient of 16 bits, and for the decoding, it is supplied with a code data of 8 bits. For the coding, the output FIFO memory (14) outputs 8-bit code data, and for the decoding, it outputs wavelet transform coefficients of 16 bits. Thus, the circuit scale can be reduced and data transfer speed be improved.

4 Claims, 6 Drawing Sheets

ENTROPY ENCODER/DECODER

BACKGROUND OF THE INVENTION

1. Field of the Invention

The present invention relates to an entropy encoder/decoder based on EBCOT (embedded block coding with optimized truncation) or the like used in JPEG2000 for example.

This application claims the priority of the Japanese Patent Application No. 2002-045250 filed on Feb. 21, 2002, the entirety of which is incorporated by reference herein.

2. Description of the Related Art

Recently, there has been proposed a still picture compression method adopting a discrete wavelet transform called JPEG 2000 (ISO/IEC JTC 1/SC 29/WG1).

JPEG 2000 uses a coding called "EBCOT (embedded block coding with optimized truncation)" for the entropy coding in order to make the most of the features of the discrete wavelet transform.

EBCOT is implemented with the use of a bit modeling unit and an arithmetic encoder/decoder (the "encoder/decoder" will be referred to as "codec" hereunder). The bit modeling unit provides a bit modeling in which an arithmetic-coding binary symbol and a context indicative of the arithmetic coding method are generated from the wavelet transform coefficient generated by the discrete wavelet transform, and effects the bit modeling reversely. The arithmetic codec fractionates a probability line correspondingly to an appearance probability of a generated sequence of symbols, makes an arithmetic coding to assign a binary decimal value indicative of a position in each of the fractions to a code corresponding to the code sequence, and effects the fractionation and arithmetic coding reversely.

Generally, FIFO (first-in first-out) memories are generally provided at input and output stages, respectively, of an EBCOT-based entropy codec circuit to continuously effect the coding and decoding without a break between them.

The EBCOT-based entropy codec having the FIFO memories provided at the input and output stages thereof is constructed as will be described in detail below with reference to FIGS. 1 and 2.

The entropy codec generally indicated with a reference 101 includes a wavelet transform coefficient input FIFO memory 102 to store supplied wavelet transform coefficients, code data input FIFO memory 103 to store supplied code data, code data output FIFO memory 104 to store to-be-outputted code data, wavelet transform coefficient output FIFO memory 105 to store to-be-outputted wavelet transform coefficients, bit modeling unit 106 and an arithmetic codec 107. It should be noted that the wavelet transform coefficient and code data to be supplied to or outputted from the entropy codec 101 are of 16 bits and 8 bits, respectively.

Figure 1:
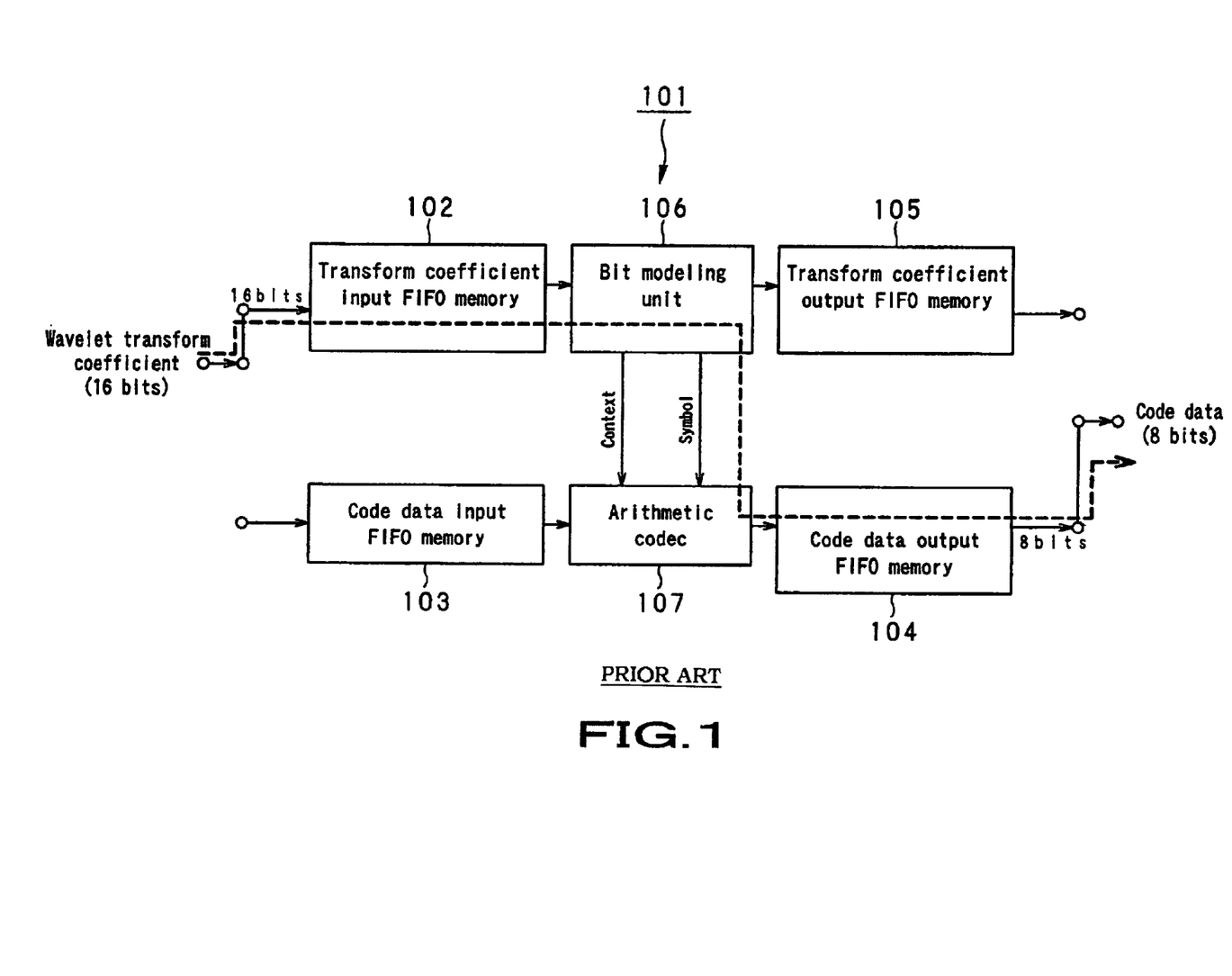
FIG. 1 explains a flow of coding operations in the conventional entropy codec.

For coding, wavelet transform coefficients each of 16 bits are supplied from an external wavelet transform unit to the wavelet transform coefficient input FIFO memory 102 as shown in FIG. 1. The wavelet transform coefficient input FIFO memory 102 transfers wavelet transform coefficients stored therein one after another to the bit modeling unit 106. The bit modeling unit 106 generates a symbol and context from the wavelet transform coefficients thus received, and outputs them to the arithmetic codec 107. The arithmetic codec 107 generates a code data of 8 bits from the symbol and context thus received, and outputs the data to the code data output FIFO memory 104. The code data output FIFO memory 104 outputs 8-bit code data stored therein one after another to an external code forming device.

Figure 2:
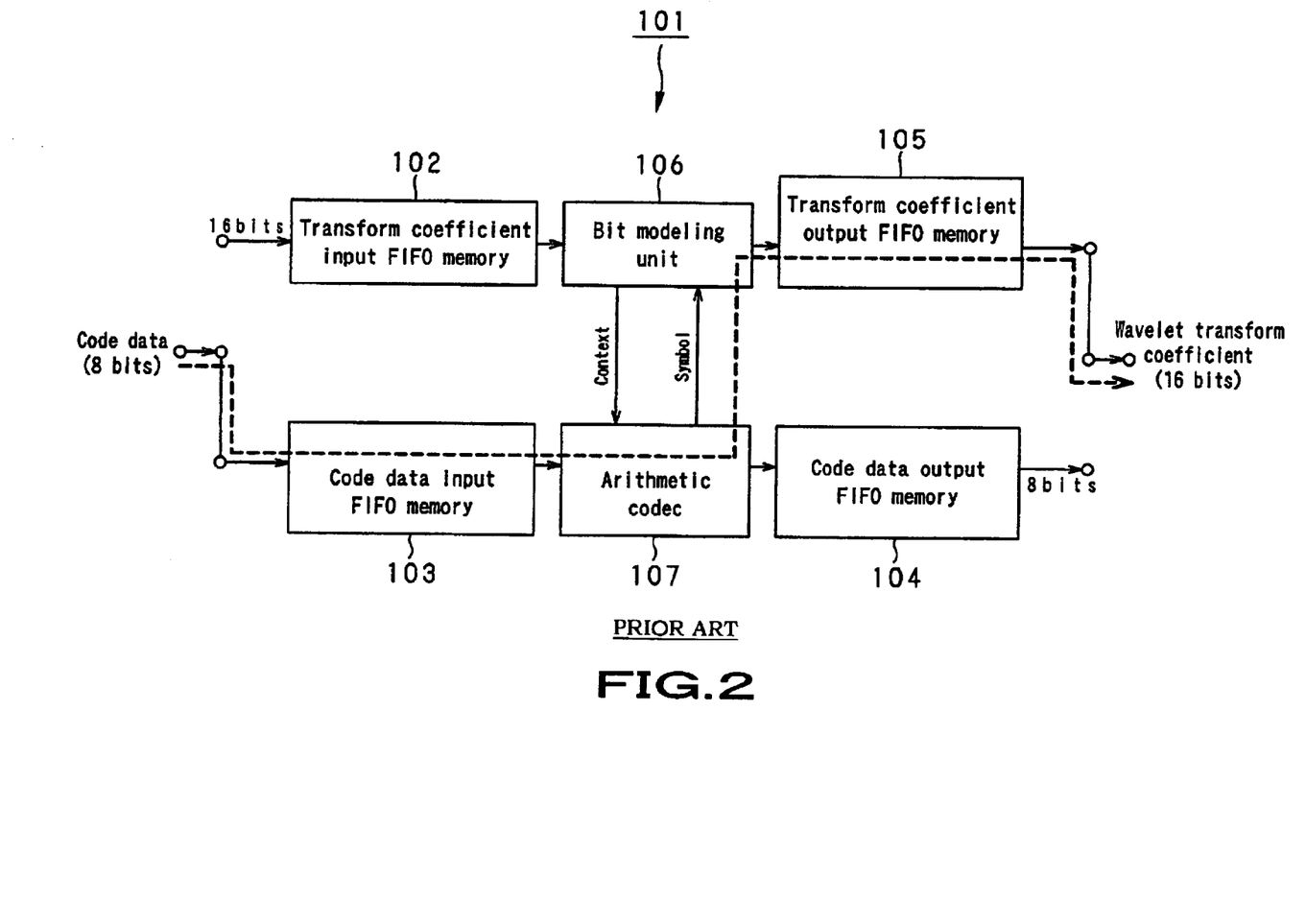
FIG. 2 explains a flow of decoding operations in the conventional entropy codec.

For decoding, an 8-bit code data is supplied from the external code forming device to the code data input FIFO memory 103, as shown in FIG. 2. The code data input FIFO memory 103 transfers code data stored therein one after another to the arithmetic codec 107. The arithmetic codec 107 generates a symbol from the code data thus received and a context supplied from the bit modeling unit 106, and outputs the symbol to the bit modeling unit 106. The bit modeling unit 106 generates a context and 16-bit wavelet transform coefficient from the symbol thus received. The bit modeling unit 106 outputs the context to the arithmetic codec 107 while outputting the 16-bit wavelet transform coefficient to the wavelet transform coefficient output FIFO memory 105. The wavelet transform coefficient output FIFO memory 105 outputs 16-bit wavelet coefficients stored therein one after another to the external wavelet transform unit.

Having the FIFO memories provided in the input and output stages, the entropy codec 101 can continuously effect the coding and decoding without a break between them.

In the EBCOT-based entropy coding/decoding, the data bit is different in length between before and after the coding and also between before and after the decoding. That is, the wavelet transform coefficient and code data after arithmetically coded are different in bit length from each other. Thus, the FIFO memories provided at the input and output stages of the EBCOT-based entropy codec should include a total of four FIFO memories for input of discrete wavelet coefficients, input of code data, output of discrete wavelet coefficients and for output of code data, respectively, as mentioned above.

Of such four FIFO memories, however, those intended for decoding are not in operation when in the coding mode of operation of the EBCOT-based entropy codec while those intended for coding are not in operation when in the decoding mode of operation. That is to say, the EBCOT-based entropy codec with the four FIFO memories has a redundant circuitry. Also, it is necessary to provide, outside the entropy codec 101, a selector to make a selection between input data and a selector to make a selection between output data. On this account, the data transfer rate of the entropy codec 101 will be lower because of the selection made by the selectors. Especially in case a memory used in common in the entire coding system (JPEG 2000 coding system, for example) is used as each FIFO memory, the data transfer rate will be considerably lower.

SUMMARY OF THE INVENTION

It is therefore an object of the present invention to overcome the above-mentioned drawbacks of the related art by providing an entropy encoder/decoder having a reduced circuitry scale and an improved data transfer rate.

The above object can be attained by providing an entropy encoder/decoder including, according to the present invention, an input FIFO (first-in first-out) memory to provisionally hold supplied data and output data held therein in their supplied order, an output FIFO memory to provisionally hold supplied data and output data held therein in their supplied order, a bit modeling means for making a bit modeling, an arithmetic coding/decoding means for making an arithmetic coding and effecting the arithmetic coding reversely, and a control means for controlling the number of data bits held in each of the input and output FIFO memories.

For the coding, the input FIFO memory is externally supplied with a multivalued data having a first number of bits and outputs the multivalued data to the bit modeling means, and for the decoding, it is externally supplied with a code data having a second number of bits, different from the first number of bits in the multivalued data and outputs the code data to the arithmetic coding/decoding means.

For the coding, the output FIFO memory is supplied with the code data having the second number of bits from the arithmetic coding/decoding means and outputs the code data to outside, and for the decoding, it is supplied with the multivalued data having the first number of bits from the bit modeling means and outputs the multivalued data to outside.

For the coding, the bit modeling means is supplied with the multivalued data from the input FIFO memory and generates an arithmetic-coding binary symbol and a context indicative of the arithmetic coding method from the multi-valued data, and for the decoding, it is supplied with a symbol from the arithmetic coding/decoding means and generates a context and a multivalued data based on the symbol thus supplied.

For the coding, the arithmetic coding/decoding means is supplied with the symbol and context from the bit modeling means and generates a code data based on the symbol and context thus supplied, and for the decoding, it is supplied with the code data from the input FIFO memory and the context from the bit modeling means and generates a symbol based on the code data and context.

For the coding, the control means sets a valid number of bits held in the input FIFO memory as the above first number of bits and a valid number of bits held in the output FIFO memory as the above second number of bits, and for the decoding, it sets a valid number of bits held in the input FIFO memory as the above second number of bits and a valid number of bits held in the output FIFO memory as the above first number of bits.

These objects and other objects, features and advantages of the present invention will become more apparent from the following detailed description of the preferred embodiments of the present invention when taken in conjunction with the accompanying drawings.

DETAILED DESCRIPTION OF THE PREFERRED EMBODIMENTS

The EBCOT (embedded block coding with optimized truncation) encoder/decoder (will be referred to as "codec" hereunder) according to the present invention will be described as an embodiment of the present invention. The EBCOT codec is an entropy codec used as an encoder/decoder conforming to JPEG 2000 or the like.

Figure 3:
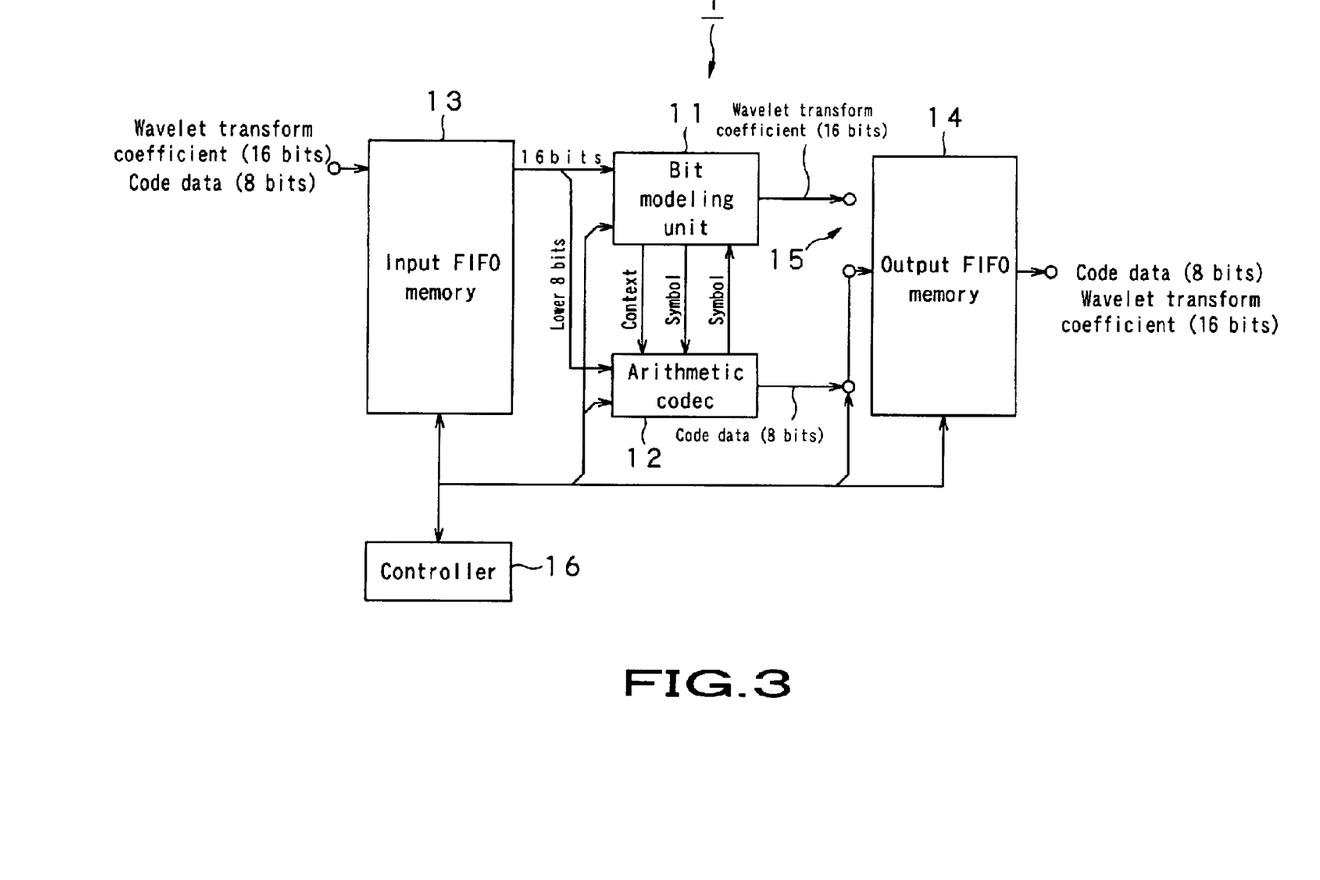
FIG. 3 is a block diagram of the EBCOT codec according to the present invention.

FIG. 3 is a block diagram of the embodiment of the EBCOT codec according to the present invention.

The EBCOT codec is generally indicated with a reference 1. For the coding, the EBCOT codec 1 is supplied with a multivalued wavelet transform coefficient from an external wavelet transform device, generates a code data by an EBCOT-based bit modeling and EBCOT-based arithmetic coding of the wavelet transform coefficient, and outputs the code data to an external code forming device. For the decoding, the EBCOT codec 1 is supplied with a code data from the external code forming device, generates a multi-valued wavelet transform coefficient by making an EBCOT-based arithmetic decoding and EBCOT-based bit modeling of the code data, and outputs the multivalued wavelet transform coefficient to the external wavelet transform device. It should be noted that the wavelet transform coefficient is different in bit length from the code data. It is assumed herein that the wavelet transform coefficient has a bit length of 16 bits and the code data has a bit length of 8 bits.

As shown in FIG. 3, the EBCOT codec 1 includes a bit modeling unit 11, arithmetic codec 12, input FIFO memory 13, output FIFO memory 14, internal selector 15 and a controller 16.

For the coding, the bit modeling unit 11 is supplied with a wavelet transform coefficient from the input FIFO memory 13. The bit modeling unit 11 makes an EBCOT-based bit modeling of the supplied wavelet transform coefficient. More specifically, for the coding, the bit modeling unit 11 generates an arithmetic-coding symbol and context from the wavelet transform coefficient. The bit modeling unit 11 outputs the symbol and context thus generated to the arithmetic codec 12.

For the decoding, the bit modeling unit 11 is supplied with a symbol from the arithmetic codec 12. For the decoding, the bit modeling unit 11 effects the coding operations reversely. That is, for the decoding, the bit modeling unit 11 generates a context and wavelet transform coefficient from the supplied symbol. The bit modeling unit 11 outputs the context this generated to the arithmetic codec 12, and the wavelet transform coefficient thus generated to the output FIFO memory 14 through the internal selector 15.

For the coding, the arithmetic codec 12 is supplied with the symbol and context from the bit modeling unit 11. The arithmetic codec 12 generates a code data by making an arithmetic coding of the supplied symbol and context. The "arithmetic coding" is to fractionate a probability line correspondingly to the appearance probability of a sequence of symbols and assign binary decimal values indicating positions in the line fractions to a code corresponding to the code sequence. The arithmetic codec 12 outputs the code data thus generated to the output FIFO memory 14 through the internal selector 15.

For the decoding, the arithmetic codec 12 is supplied with a code data from the input FIFO memory 13. The arithmetic codec 12 generates a symbol through decoding of the supplied code data effecting the arithmetic coding reversely. The arithmetic codec 12 outputs the symbol thus decoded to the bit modeling unit 11. Namely, for the decoding, the arithmetic codec 12 will decode a symbol by generating a code data with reference to a context supplied from the bit modeling unit 11. At this time, the code data will not be outputted to outside the arithmetic codec 12. It should be noted that when a first one symbol is decoded, no context will be supplied to the arithmetic codec 12 from the bit modeling unit 11 but in this case, a symbol is decoded based on a context having an arbitrarily defined initial value.

The input FIFO memory 13 is a first-in first-out data buffer memory. That is, the input FIFO memory 13 provisionally holds supplied data, and outputs data held therein in their supplied order. The input FIFO memory 13 works as a buffer memory dedicated to data supplied to the EBCOT codec 1. Namely, for the coding, the input FIFO memory 13 buffers the wavelet transform coefficient, and for the decoding, it buffers the code data.

The output FIFO memory 14 is also a first-in first-out data buffer memory. That is, the output FIFO memory 14 provisionally holds input data, and outputs data held therein in their supplied order. The output FIFO memory 14 works as a buffer memory dedicated to output data from the EBCOT codec 1. Namely, for the coding, the output FIFO memory 14 buffers the code data, and for the decoding, it buffers the wavelet transform coefficient.

The input and output FIFO memories 13 and 14 can selectively store data having different bit lengths. For the selective storage of data of different bit lengths, the input and output FIFO memories 13 and 14 take the data width of an input data bus and output data bus, for example, as the maximum bit length of input data. When each of the input and output FIFO memories 13 and 14 is supplied with a data having a smaller bit length than the maximum bit length, it will take only a line on which valid bits are transferred as valid and other lines as invalid.

Figure 4:
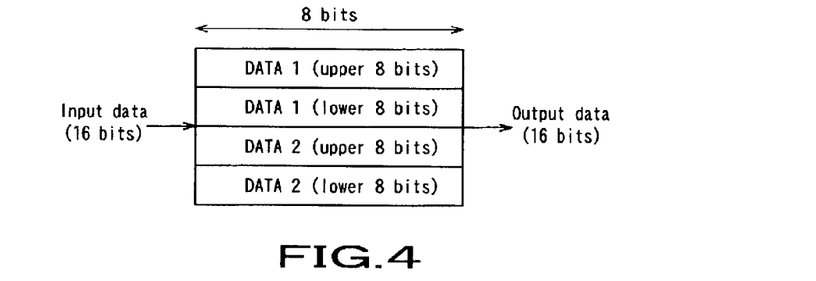
FIG. 4 explains how the FIFO memory works when the EBCOT codec is supplied with 16-bit data.
Figure 5:
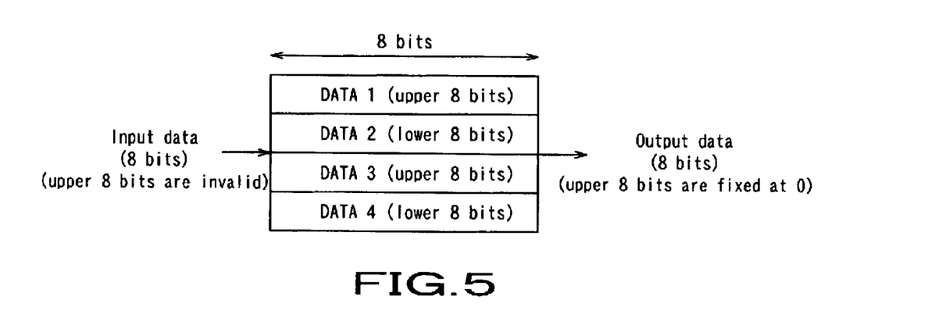
FIG. 5 explains how the FIFO memory works when the EBCOT codec is supplied with 8-bit data.

In this embodiment, the input and output FIFO memories 13 and 14 can selectively store 16-bit data (wavelet transform coefficient) and 8-bit data (code data). For the selective storage of the 16-bit and 8-bit data, each of the FIFO memories should be constructed as follows by way of example:

That is, the input and output FIFO memories 13 and 14 are supplied with 16-bit data on the input data bus and output 16-bit data on the output data bus. They divide the input data into upper 8 bits and lower 8 bits for storage. More specifically, when supplied with 16-bit data, the input and output FIFO memories 13 and 14 validate all the input data buses and divide the supplied 16-bit data into upper 8 bits and lower 8 bits for storage, as shown in FIG. 4. Then, they validate all the output data buses, combine the upper and lower 8 bits stored therein and transfer the resultant 16-bit data on the output data bus. On the other hand, when supplied with 8-bit data, the input and output FIFO memories 13 and 14 validate only the lower 8 bits on the input data bus while invalidating the upper 8 bits, and store only the supplied 8 bits of data, as shown in FIG. 5. The output data bus is fixed at "0" for the upper 8 bits while transferring transfer 8-bit data stored in the memories for the lower 8 bits. The input FIFO memory 13 and bit modeling unit 11 are connected to each other by a 16-bit data bus whose lower 8 bits are connected to the arithmetic codec 12. Similarly, the output FIFO memory 14 and bit modeling unit 11 are connected to each other by a 16-bit data bus whose lower 8 bits are connected to the arithmetic codec 12.

The internal selector 15 is provided to selectively provide either a connection between the bit modeling unit 11 and output FIFO memory 14 or a connection between the arithmetic codec 12 and output FIFO memory 14. For the coding, the internal selector 15 connects the arithmetic codec 12 and output FIFO memory 14 to each other, and for the decoding, it connects the bit modeling unit 11 and output FIFO memory 14 to each other.

The controller 16 makes a switching from one function to another of each of the other components correspondingly to a time for the coding or decoding. For the coding, the controller 16 will put the input FIFO memory 13 into a storage mode for 16-bit data and the output FIFO memory 14 into a storage mode for 8-bit data. Also for the coding, the controller 16 will put the bit modeling unit 11 and arithmetic codec 12 into a mode of operation for the coding, and control the internal selector 15 to connect the arithmetic codec 12 and output FIFO memory 14 to each other. For the decoding, the controller 16 will put the input FIFO memory 13 into a storage mode for 8-bit data and the output FIFO memory 14 into a storage mode for 16-bit data. Also for the decoding, the controller 16 will put the bit modeling unit 11 and arithmetic codec 12 into a mode of operation for the decoding, and control the internal selector 15 to connect the bit modeling unit 11 and output FIFO memory 14 to each other.

Figure 6:
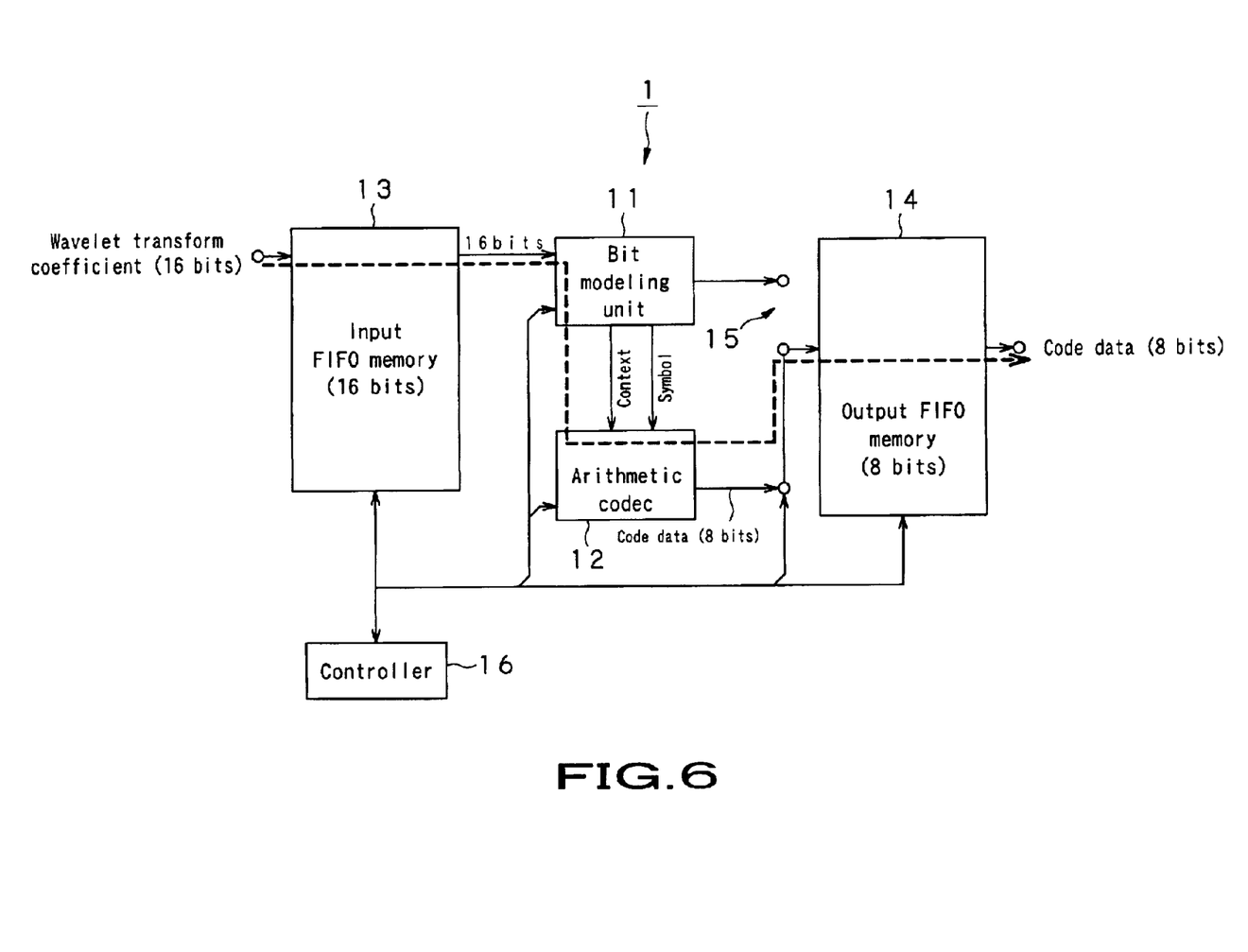
FIG. 6 explains a flow of coding operations in the EBCOT codec.

Next, the flow of operations made in the EBCOT-based codec 1 for the coding will be described with reference to FIG. 6.

For the coding, the input FIFO memory 13 is put into the storage mode for 16-bit data, while the output FIFO memory 14 is put into the storage mode for 8-bit data. For the coding, the input FIFO memory 13 is supplied with a 16-bit wavelet transform coefficient from the external wavelet transform device. The input FIFO memory 13 transfers wavelet transform coefficients stored therein sequentially to the bit modeling unit 11. At this time, the input data bus of the arithmetic codec 12 is invalidated. The bit modeling unit 11 generates a symbol and context from the wavelet transform coefficients thus received, and outputs them to the arithmetic codec 12. The arithmetic codec 12 generates an 8-bit code data from the symbol and context supplied from the bit modeling unit 11, and outputs it to the output FIFO memory 14 through the internal selector 15. The output FIFO memory 14 outputs 8-bit code data stored therein sequentially to the external code forming device.

Figure 7:
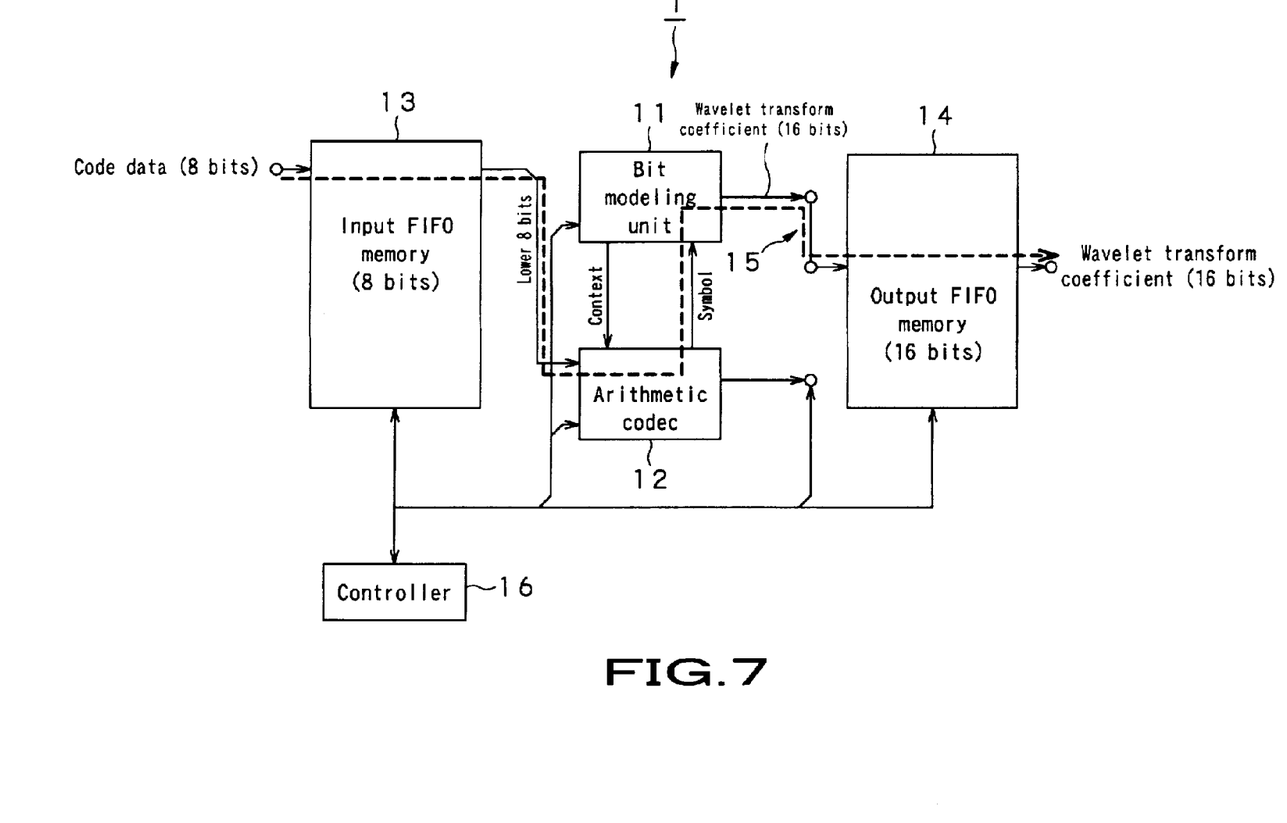
FIG. 7 explains a flow of decoding operations in the EBCOT codec.

Next, the flow of operations made in the EBCOT codec 1 for the decoding will be described with reference to FIG. 7.

For the decoding, the input FIFO memory 13 is put into the storage mode for 8-bit data, while the output FIFO memory 14 is put into the storage mode for 16-bit data. For the decoding, the input FIFO memory 13 is supplied with an 8-bit code data from the external wavelet transform device. The input FIFO memory 13 transfers code data stored therein sequentially to the arithmetic codec 12 via the internal selector 15. The arithmetic codec 12 generates a symbol from the code data thus received and context supplied from the bit modeling unit 11, and outputs it to the bit modeling unit 11. The bit modeling unit 11 generates a context and 16-bit wavelet transform coefficient from the symbol thus received. The bit modeling unit 11 outputs the context to the arithmetic codec 12, and the 16-bit wavelet transform coefficient to the output FIFO memory 14. The output FIFO memory 14 outputs 16-bit wavelet transform coefficients stored therein sequentially to the external wavelet transform device.

As having been described in the foregoing, the EBCOT codec 1 according to the present invention uses FIFO memories having a function to control the bit length of to-be-stored data correspondingly to the bit length of input data as the FIFO memories provided at the input and output stages to continuously effect the coding and decoding without a break between them. Thus, in the EBCOT codec 1 according to the present invention, only the two FIFO memories permit to continuously effect the coding and decoding without a break between them as in the conventional entropy codec. That is, the present invention can reduce the scale of circuitry. Also, the EBCOT codec 1 according to the present invention makes it unnecessary to externally provide any selector for making a selection between input and output data lines, whereby it is made possible to prevent a reduction in data transfer speed due to the switching by the selector between the data lines.

In the foregoing, the EBCOT codec 1 according to the present invention has been described on the assumption that the bit length of wavelet transform coefficient is 16 bits and that of code data is 8 bits. However, it should be noted that the present invention is not limited to such a combination of 16 bits and 8 bits but any bit length combination. Also, the bit length of data for supply to the FIFO memories may be in more than 3 kinds.

Further, in the aforementioned EBCOT codec 1 according to the present invention, the input to, and output from, one FIFO memory are equal in bit length to each other. However, the input and output may be made different in bit length from each other, such as an input data bit length of 8 bits and output data bit length of 16 bits. When output data is of 8 bits, for example, the upper 8 bits should be zero so that the whole data includes 16 bits.

In the entropy codec according to the present invention, the input and output FIFO memories intended to continuously effect the coding and decoding without a break between them have a function to control the bit length of a to-be-stored data correspondingly to the bit length of supplied data.

Thus, the present invention is much contributed to a reduction of circuitry scale and improvement of the data transfer speed.

In the foregoing, the present invention has been described in detail concerning certain preferred embodiments thereof as examples with reference to the accompanying drawings. However, it should be understood by those ordinarily skilled in the art that the present invention is not limited to the embodiments but can be modified in various manners, constructed alternatively or embodied in various other forms without departing from the scope and spirit thereof as set forth and defined in the appended claims.

What is claimed is:

1. An entropy encoder/decoder having a coding mode and a decoding mode, comprising:
   an input FIFO (first-in first-out) memory to provisionally hold supplied data and output data held therein in their supplied order;
   an output FIFO memory to provisionally hold supplied data and output data held therein in their supplied order;
   a bit modeling means for performing a bit modeling operation;
   an arithmetic coding/decoding means for performing an arithmetic coding operation; the arithmetic coding/decoding means being connected to the bit modeling means; and
   a control means for controlling operation of the entropy encoder/decoder in said coding mode and said decoding mode;
   wherein, in the coding mode, the input FIFO memory is connected to the bit modeling means and the output FIFO memory is connected to the arithmetic coding/decoding means; and in the decoding mode, the input FIFO memory is connected to the arithmetic coding/decoding means and the output FIFO memory is connected to the bit modeling means.

2. The entropy encoder/decoder as set forth in claim 1, wherein:
   for the coding mode, the input FIFO memory is externally supplied with wavelet transform coefficients having a first number of bits and outputs wavelet transform coefficients to the bit modeling means, and for the decoding mode, it is externally supplied with a code data having a second number of bits, different from the first number of bits and outputs the code data to the arithmetic coding/decoding means; and
   for the coding mode, the output FIFO memory is supplied with the code data having the second number of bits from the arithmetic coding/decoding means and outputs the code data; and for the decoding mode, it is supplied with the wavelet transform coefficients having the first number of bits from the bit modeling means and outputs the wavelet transform coefficients.

3. The entropy coder/decoder as set forth in claim 2, wherein:
   for the coding mode, the bit modeling means is supplied with the wavelet transform coefficients from the input FIFO memory and generates an arithmetic coding binary symbol and a context indicative of an arithmetic coding method from the wavelet transform coefficients; and for the decoding mode, it is supplied with a symbol from the arithmetic coding/decoding means and generates a context and wavelet transform coefficients based on the symbol thus supplied; and
   for the coding mode, the arithmetic coding/decoding means is supplied with the symbol and context from the bit modeling means and generates a code data based on the symbol and context thus supplied; and for the decoding mode, it is supplied with the code data from the input FIFO memory and the context from the bit modeling means and generates a symbol based on the code data and context.

4. The entropy coder/decoder as set forth in claim 2, wherein:
   for the coding mode, the control means sets a valid number of bits held in the input FIFO memory as the above first number of bits and a valid number of bits held in the output FIFO memory as the above second number of bits; and
   for the decoding mode, it sets a valid number of bits held in the input FIFO memory as the above second number of bits and a valid number of bits held in the output FIFO memory as the above first number of bits.

* * * * *